(12) United States Patent
Johnson

(10) Patent No.: US 6,511,577 B1
(45) Date of Patent: Jan. 28, 2003

(54) REDUCED IMPEDANCE CHAMBER

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 09/686,167

(22) Filed: Oct. 12, 2000

Related U.S. Application Data

(63) Continuation of application No. PCT/US99/07962, filed on Apr. 12, 1999.
(60) Provisional application No. 60/081,486, filed on Apr. 13, 1998.

(51) Int. Cl.$^7$ .......................................... H01L 21/3065
(52) U.S. Cl. ............................ 156/345.48; 156/345.54; 156/345.44; 118/723 R; 118/723 I; 118/729; 118/723 E
(58) Field of Search ........................... 118/50, 50.1, 666, 118/697, 708, 715, 719, 723 AN, 723 E, 723 EB, 723 ER, 723 I, 723 IR, 723, 723 ME, 723 MP, 723 MW, 723 R, 725; 204/192.1, 192.12, 192.13, 192.15, 192.16, 192.2, 192.25, 192.3, 192.38, 298.04, 298.05, 298.06, 298.08, 298.09, 298.12

(56) References Cited

U.S. PATENT DOCUMENTS

| | | | |
|---|---|---|---|
| 4,209,357 A | | 6/1980 | Gorin et al. ................. 438/710 |
| 4,464,223 A | | 8/1984 | Gorin ......................... 438/729 |
| 4,585,920 A | | 4/1986 | Hoog et al. ............. 219/121.52 |
| 4,844,775 A | | 7/1989 | Keeble ......................... 216/68 |
| 4,854,263 A | | 8/1989 | Chang et al. ............... 376/272 |
| 4,918,031 A | | 4/1990 | Flamm et al. .............. 438/695 |
| 5,292,370 A | * | 3/1994 | Tsai et al. ............. 118/723 MP |
| 5,464,499 A | * | 11/1995 | Moslehi et al. ............. 438/729 |
| 5,534,231 A | | 7/1996 | Savas .......................... 216/67 |
| 5,614,055 A | | 3/1997 | Fairbairn et al. ........... 156/345 |
| 5,917,286 A | * | 6/1999 | Scholl et al. ........... 315/111.21 |
| 5,997,962 A | * | 12/1999 | Ogaawara et al. .......... 427/535 |
| 6,132,551 A | * | 10/2000 | Horioka et al. ............. 156/345 |
| 6,245,202 B1 | * | 6/2001 | Edamura et al. ....... 204/298.06 |
| 6,220,201 B1 | * | 8/2001 | Nowak et al. ............ 118/723 I |
| 6,287,435 B1 | * | 9/2001 | Drewery et al. ....... 204/298.09 |
| 6,308,654 B1 | * | 10/2001 | Schneider et al. ........ 118/723 I |

FOREIGN PATENT DOCUMENTS

| JP | 01-162772 | * | 6/1989 |
|---|---|---|---|
| JP | 11-154667 | * | 6/1999 |
| WO | WO97/39607 | * | 10/1997 |

OTHER PUBLICATIONS

Ponnekanti et al, "Failure mechanisms of anodized aluminum parts used in chemical vapor deposition chambers", J.Vac.Sci.Technol. 14(3), May/Jun. 1996, pp. 1127–1131.*
Stephen M. Rossnagel, Plasmas and Sources for Etching and Deposition, pp. 20–39.

* cited by examiner

*Primary Examiner*—Gregory Mills
*Assistant Examiner*—Rudy Zervigon
(74) *Attorney, Agent, or Firm*—Pillsbury Winthrop LLP

(57) ABSTRACT

A reduced impedance chamber for plasma processing leads to operational advantages including a plasma sheath voltage that is substantially independent of plasma impedance over a range of plasma impedances. The design of such a reduced impedance chamber includes a chuck assembly, a counter electrode, and a plasma source. The chuck assembly allows mounting of a workpiece for processing and includes a driven electrode and a ground portion. The plasma source operates to generate a plasma in the chamber from process gas. A wall portion of the plasma source is directly electrically connected to the counter electrode and to the ground portion of the chuck assembly. The counter electrode may include an inject-exhaust plate that is mounted in a position opposed to the chuck assembly and that operates to inject process gas into the chamber and to exhaust effluent.

18 Claims, 18 Drawing Sheets

REDUCED IMPEDANCE CHAMBER

This is a Continuation International Appln. No. PCT/US99/07962 filed Apr. 12, 1999 which designated the U.S. This application claims the benefit of U.S. Provisional Application No. 60/081,486, filed Apr. 13, 1998.

BACKGROUND OF THE INVENTION

1. Field of Invention

The present invention relates to a reduced-impedance chamber for use in plasma processing applications and more particularly to a chamber that can be used in repeatable and controllable plasma processing applications.

2. Description of Related Art

A conventional chamber, as shown in FIG. 1, includes a process chamber 10 having a chamber wall 12. A chuck assembly 14 is mounted on a bellows 13 that is mounted on a chuck mount ring 16. Chuck mount ring 16 includes spokes 18 through which chuck mount ring 16 is connected to chuck assembly 14. A workpiece, such as a semiconductor wafer 15, is mounted on chuck assembly 14. RF energy can be applied to chuck assembly 14 through a chuck impedance matching assembly 20. A plasma source 24 and an injection assembly 21 through which operational gases are injected into chamber 10 are above chuck assembly 14. A turbo-molecular pump 26 for evacuating operational gases is below chuck assembly 14. A gate valve 25 between chuck assembly 14 and turbo-molecular pump 26 provides selective isolation of turbo-molecular pump 26 from chamber 10 to enable detection of leaks by monitoring the leak up rate and to enable regulation of chamber pressure by varying the conductance to turbo-molecular pump 26. Coil 28 is provided in plasma source 24 to create a plasma therein. RF energy is supplied to coil 28 through fast match assembly 22.

The chamber illustrated in FIG. 1 operates as follows. First bellows 13 is lowered. Then wafer 15 is introduced through a slot valve (not shown) in the side of process chamber 10 usually below the operating position of chuck assembly 14. Wafer 15 comes in on a blade (not shown) which has slots to allow for typically three pins (not shown) in chuck assembly 14. The pins are able to move up and down by a mechanism internal to chuck assembly 14. Once wafer 15 is over chuck assembly 14, the pins lift wafer 15 off the blade, and the blade is then removed. After the blade is removed, the pins are lowered so that wafer 15 rests on chuck assembly 14, and bellows 13 is raised.

A relatively high DC voltage is then applied at chuck assembly 14 to fix wafer 15 to chuck assembly 14. Wafer 15 is electrically isolated from chuck assembly 14. In one common version, chuck assembly 14 is anodized, usually by a special process with additional post coating to improve dielectric properties. In a second version a conductive material is positioned between polyamide sheets. The conductive material receives the clamping voltage. Chuck assembly 14 is not held at the electrostatic voltage but is at the DC ground. The chuck achieves a potentially high negative DC voltage through self-bias and leakage current. Since the chuck is capacitively coupled, it can achieve a DC voltage.

Operational gases are injected into chamber 10 through injection assembly 21. RF energy is applied to coil 28 to create a plasma, and RF energy is applied to chuck assembly 14 through matching network 20 to generate a negative voltage on the wafer by means of self-bias. The self bias phenomenon results from the greater mobility of electrons as compared with the ions. For the ions to be drawn to the wafer surface at the same rate per RF cycle as the electrons, the wafer surface must generate the negative voltage. This is important for the process because it allows the ions to be accelerated to the wafer surface at an energy determined by the chuck RF voltage and the plasma parameters. After the process is completed, the injection of reactive gases is halted, the RF chuck power is removed, the wafer clamping DC voltage is removed or slightly reversed, the RF plasma energy is stopped, bellows 13 is lowered, and wafer 15 is removed.

If chuck assembly 14 is monopolar, then there is no means to deliver charge to wafer 15 through chuck assembly 14 during the clamping and unclamping of wafer 15. Wafer 15 must accumulate charge opposite to the chuck electrostatic electrode. The plasma is the most common means to complete the clamping circuit to wafer 15 since the plasma is a sufficiently good conductor even at low power levels. Usually the plasma is kept on at low power levels during clamping and unclamping operations.

The plasma completes a circuit path between the driven electrode at chuck assembly 14 (i.e., plasma cathode) and the typically grounded counter electrode (i.e., plasma anode). The counter electrode is usually injection assembly 21. In many systems, there are areas of the chamber wall that function as the counter electrode; if these walls are too close to the wafer, then they generate process uniformity problems or non-normal ion-accelerating electric fields. With the normal positioning of chuck assembly 14 in chamber 10, the counter electrode conducts to ground through the following path: (1) from injection assembly 21; (2) through plasma source 24; (3) along inner wall 12 of chamber 10; (4) through spokes 18 to the outer diameter of bellows 13; (5) through bellows 13; and (6) to the base of chuck assembly 14. The combination of chamber 10, bellows 13, spokes 18, plasma source 24 and injection assembly 21 represents a relatively high impedance as compared with the plasma bulk and sheath impedance.

FIG. 2 shows the equivalent circuit of the conventional chamber of FIG. 1. Chuck assembly 14, which is modeled by an inductor 100, a resistor 102, a capacitor 104, a capacitor 106 and an inductor 140, is adjacent to the position in the circuit corresponding to wafer 15. Proximate to wafer 15 are a capacitor 108 and a resistor 110, which are used to model the RF current that bypasses the sheath and heats the plasma. The rest of the model for the plasma includes a resistor 136, a resistor 138 and a current source 135, where current source 135 produces a current related to plasma parameters at wafer 15. As discussed above, the path to ground from injection assembly 21 is through plasma source 24, modeled by a capacitor 130, an inductor 132 and an inductor 134, wall 12 (including the electrostatic shield), modeled by a capacitor 124, an inductor 126 and an inductor 128, spokes 18, modeled by a capacitor 118, an inductor 120 and an inductor 122, and bellows 13, modeled by a capacitor 112, an inductor 114 and an inductor 116. An RF power supply 139, which is modeled as a voltage source 148 and a resistor 150, is connected to chuck assembly 14 through matching network 20, which is modeled as a capacitor 142, a capacitor 144 and an inductor 146.

All of these components contribute to the impedance in the ground path. Typically, the connection to the chuck can have an inductance of 50 nh and a capacitance to ground of 200 pf; the bellows can have an inductance of 250 nh and a capacitance of 100 pf, the spokes can have an inductance of 33 nh and a capacitance of 50 pf; the wall can have an inductance of 40 nh and a capacitance of 100 pf; and the plasma source can have an inductance of 40 nh and a capacitance of 100 pf.

In this model the plasma impedance is fixed. The plasma current source uses Langmuir probe data to determine the parameters of the current. These effects together produce harmonics. The generally nonlinear impedances of the elements described above result in the generation of higher order harmonics in the plasma voltage at the workpiece whereby the processing is difficult to control.

For the circuit in FIG. 2, FIG. 3 illustrates the predicted waveform of the voltage across the plasma sheath from the plasma anode to the plasma cathode. In this model the voltage across the bulk of the plasma is ignored. This voltage accelerates the ions to the wafer and controls the energy of the ions arriving at the wafer. The model assumes a perfect match for the fundamental of the RF energy at the input to the matching network 20. FIG. 4 shows the corresponding frequency spectra of the voltage across the plasma sheath for the conventional chamber. Here the fundamental frequency is approximately 13.6 MHz, the first harmonic is approximately 27.2 MHz, and the second harmonic is approximately 40.8 MHz.

The conventional chamber has a large variation in the harmonic content of the voltage across the plasma sheath when parameters of the system are varied. In high plasma densities with short sheath distances, Monte-Carlo simulations have shown that the ion energy upon arrival at the wafer is a strong function of the amount of these voltage harmonics at the wafer. This means the conventional chamber generates different ion energies under similar conditions when there are small variations in plasma density or coupling impedances in the system. Significant plasma density variations can be caused by small variations in pressure, power coupling to the plasma, or species. Likewise, coupling impedances can vary significantly because of manufacturing or refitting errors. Thus, the processing is not easily repeatable because of factors that may change from one processing sequence to another and from one chamber to another and thereby affect the level of the higher order harmonics. Such factors include:

1. Changes in the geometry of the RF components due to refitting;
2. Changes in the process pressure that change harmonic content;
3. Changes in the plasma source or chuck power that change the harmonic content;
4. Changes in the process gas species that result from changes in the process design;
5. Changes in the precise position of the match in the matching network(s).

More details of these physical processes are found in "Dynamics of Collisionless rf Plasma Sheaths" by P. A. Miller and M. E. Riley (J. Appl. Phys., Vol. 82, pp. 3689–3709, Oct. 15, 1997); this article is incorporated herein by reference.

Conventional chambers for plasma processing and their use have been discussed elsewhere. Keeble (U.S. Pat. No. 4,844,775) describes an apparatus for use in treating semiconductor wafers by an active ion technique or by chemical vapor deposition. Flamm et al. (U.S. Pat. No. 4,918,031) describes a process for anistropic plasma etching utilizing a helical resonator operated at relatively low gas pressure. Savas (U.S. Pat. No. 5,534,231) describes a plasma reactor with RF power inductively coupled into the reactor chamber to produce an RF magnetic field substantially perpendicular to a pedestal on which a wafer is placed for processing. These three patents are incorporated herein by reference.

SUMMARY OF THE INVENTION

Accordingly, it is an object of this invention to provide a chamber with reduced impedance for plasma processing.

It is a further object of this invention to provide a chamber with reduced impedance for plasma processing, where chamber walls, bellows, and spokes of the chamber bottom are not included in the conductance path from the chuck to ground.

It is a further object of this invention to provide a chamber with reduced impedance for plasma processing, where the inject electrode dimension is increased so that the voltage drop across the plasma anode sheath is very low.

It is a further object of this invention to provide a chamber with reduced impedance for plasma processing, where the ions accelerated by the plasma sheath at the element to be processed are controlled with respect to changes in fittings and variations in substrates.

It is a further object of this invention to provide a chamber with reduced impedance for plasma processing, where the frequency spectra of the plasma voltage at the element to be processed is relatively insensitive to variations in plasma impedance.

It is a further object of this invention to provide a chamber with reduced impedance for plasma processing, where the ion energy at the element to be processed can be more controlled.

It is a further object of this invention to provide a chamber with reduced impedance for plasma processing, where an inject-exhaust plate may be designed to inject the process gas uniformly over the wafer.

It is a further object of this invention to provide a chamber with reduced impedance for plasma processing, where an inject-exhaust plate may be designed to allow for exhaust gas to be pumped through it without providing significant conductance loss.

It is a further object of this invention to provide a chamber with reduced impedance for plasma processing, where an inject-exhaust plate may be designed to be temperature controlled to reduce particle generation and surface reactions.

It is a further object of this invention to provide a chamber with reduced impedance for plasma processing, where an inject-exhaust plate may be designed to be of a material that will not react with the process.

It is a further object of this invention to provide a chamber with reduced impedance for plasma processing, where an inject-exhaust plate may be designed to provide low impedance in the RF circuit path.

The above and related objects of the present invention are realized by a system that includes a plasma source for generating a plasma in a chamber. A chuck assembly for mounting an element to be processed by a plasma forms a wall of the chamber. The chuck assembly is electrically connected to the plasma source and forms the plasma cathode. A plasma anode is electrically connected to the plasma source.

The plasma anode may desirably have a larger surface area than the plasma cathode. The plasma anode may be an inject-exhaust plate formed in a position opposed from the chuck.

A preferred embodiment of the present invention includes a chuck assembly upon which is mounted a workpiece. RF energy can be applied to the workpiece through the chuck assembly. The chuck assembly is electrically connected to a plasma source. The plasma source includes a coil and an electrostatic shield. An inject-exhaust plate is connected to the plasma source. The inject-exhaust plate separates the plasma source from a pumping plenum, a turbo-molecular pump, and perhaps a conductance controlling valve (e.g., a gate valve). The chuck assembly is connected to a chuck motion assembly through a bellows. A transfer chamber is also provided near the base of the chamber. When the bellows raises the chuck assembly to its working position, the chuck assembly seals with and becomes electrically connected to the plasma source.

A preferred embodiment of an inject-exhaust plate includes an array of holes as pumping ports and gas injects.

In a second preferred embodiment of the present invention, the inject-exhaust plate includes a driven electrode as part of the plasma source to capacitively couple energy into the plasma.

BRIEF DESCRIPTION OF THE DRAWINGS

These and other objects and advantages of the invention will become more apparent and more readily appreciated from the following detailed description of the presently preferred exemplary embodiment of the invention taken in conjunction with the accompanying drawings, of which.

DETAILED DESCRIPTION OF THE PRESENTLY PREFERRED EXEMPLARY EMBODIMENTS

Figure 5:
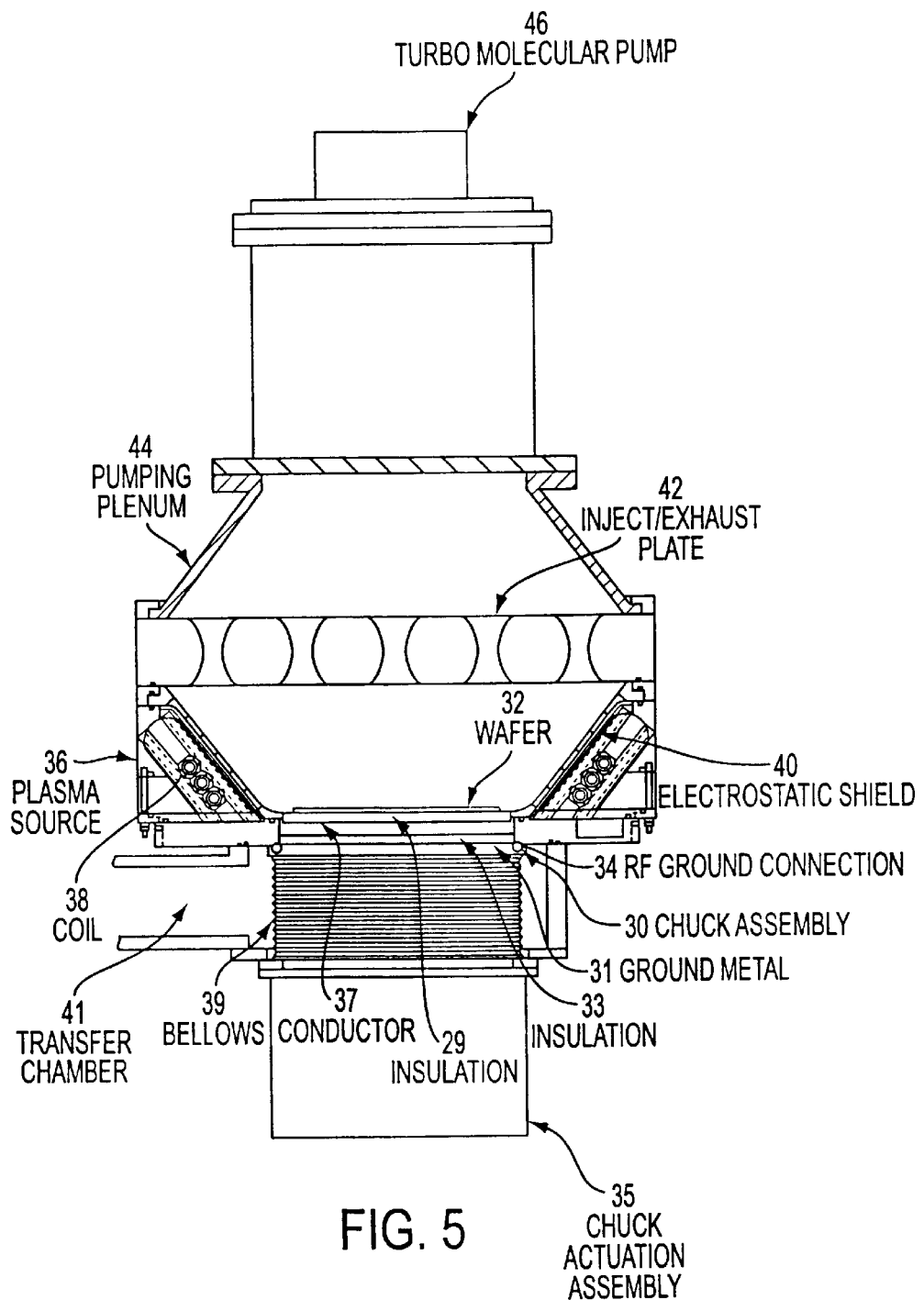
FIG. 5 is a side elevation view, partially in section, of a preferred embodiment of the reduced impedance chamber of the present invention.

The diagram of a preferred embodiment of the reduced impedance chamber of the present invention in FIG. 5 includes a chuck assembly 30 upon which is mounted a workpiece such as a semiconductor wafer 32. RF energy may be applied to wafer 32 through capacitive coupling to RF driven chuck assembly 30. Plasma source 36 includes a coil 38 and an electrostatic shield 40. An inject-exhaust plate 42 is connected to plasma source 36. Inject-exhaust plate 42 is also connected to a pumping plenum 44 and a turbo-molecular pump 46.

Chuck assembly 30 comprises a conductor 37 to which RF energy is applied, layers of insulation 29 and 33 and a ground metal 31. Insulation layer 29 separates conductor 37 from wafer 32 while insulation layer 33 separates conductor 37 from ground metal 31. Conductor 37 may include one or more conducting portions to create either a single-pole or a multi-pole chuck. Chuck assembly 30 is connected to a chuck actuation assembly 35 through a bellows 39 and linkages (not shown) for raising and lowering the chuck. A transfer chamber 41 is provided near the base of the chamber to allow for ingress and egress of wafers.

Chuck assembly 30 is usually made of anodized aluminum or polyamide layers on anodized aluminum. Bellows 39 is typically made of stainless steel when in a chamber. Most of plasma source 36 is anodized aluminum except for the areas where the RF connection is made; there the anodize is removed. Often a material known as Spira-shield is used for RF connections between elements; this is made of stainless steel spiraled around Oring material. This is put into a groove similar to an Oring groove from which the anodize is removed. Inject-exhaust plate 42 is made of anodized aluminum. The wall of plasma source 36 is made of alumina or quartz. Pumping plenum 44 is made of anodized aluminum or stainless steel. Electrostatic shield 40 is made of a conductive material.

Preferred embodiments of inject-exhaust plates 42 are illustrated in FIGS. 6, 7, 8, and 9. In general, gas injection is made uniformly over the surface of the plate, with an equal amount of gas emitted per unit area. Usually the individual jets expand at about 15-degree half angles, and the merging of the individual jets forms a fairly uniform gas distribution at the wafer. The exact pattern of the gas injection is varied during process development to achieve a uniform process. Thus, the gas injection pattern changes even for a given system for different processes.

Figure 1:
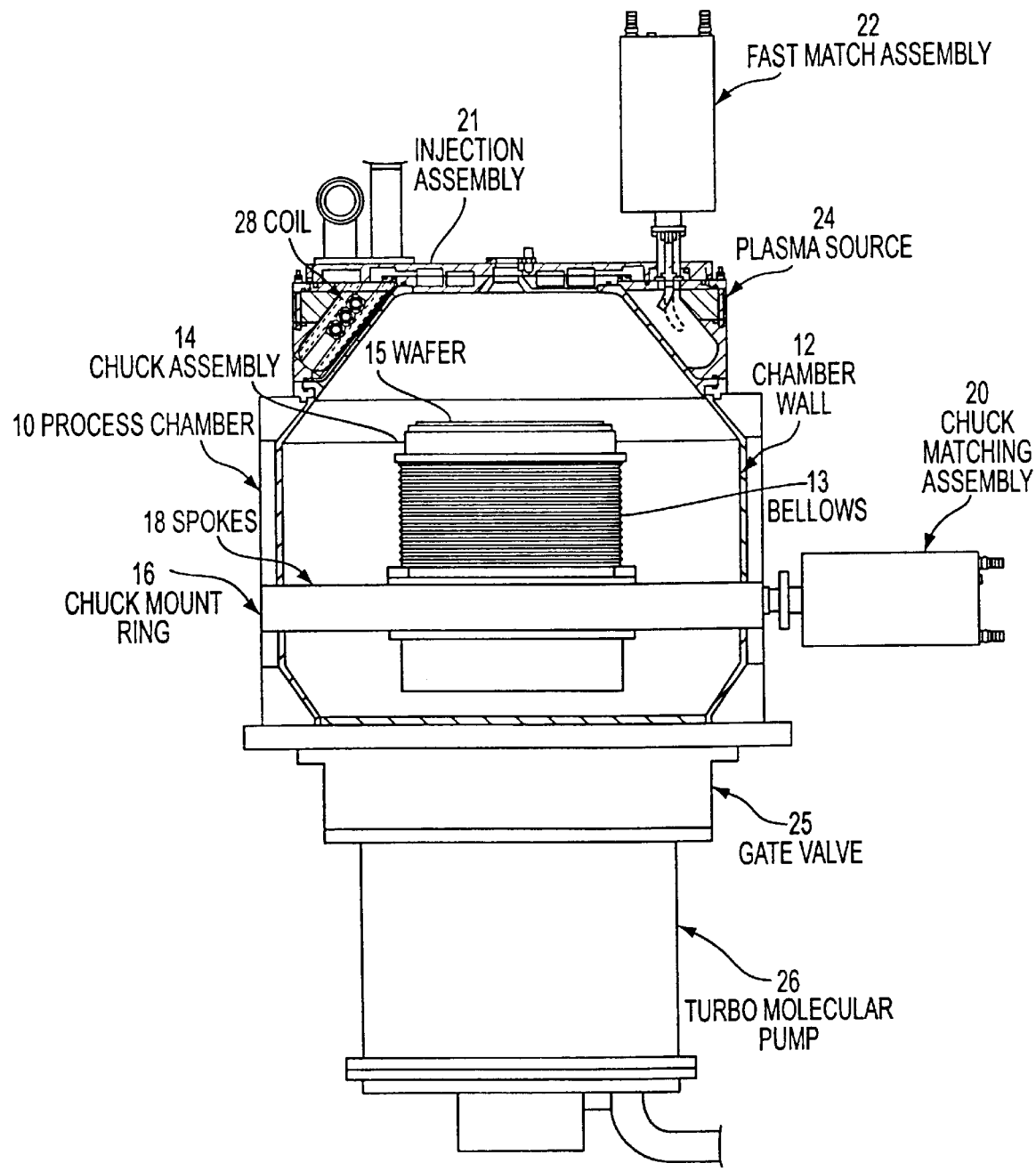
FIG. 1 is a side elevation view, partially in section, of a conventional chamber.

As compared with the conventional chamber design of FIG. 1, the use of inject-exhaust plate 42 in the reduced impedance chamber of FIG. 5 increases the inject electrode size so that the voltage drop across the anode sheath is very low. Traditional theory predicts that the anode sheath voltage drops by the fourth power of the ratio of areas of the driven electrode (i.e., the wafer) to the counter electrode (i.e., the inject surface when the rest of the chamber in contact with the plasma is lined in dielectric and has no capacitive coupling to the plasma). Thus, the voltage drop across the sheath can be made desirably low by increasing the dimensions of inject-exhaust plate 42 relative to the dimensions of wafer 32.

Figure 6:
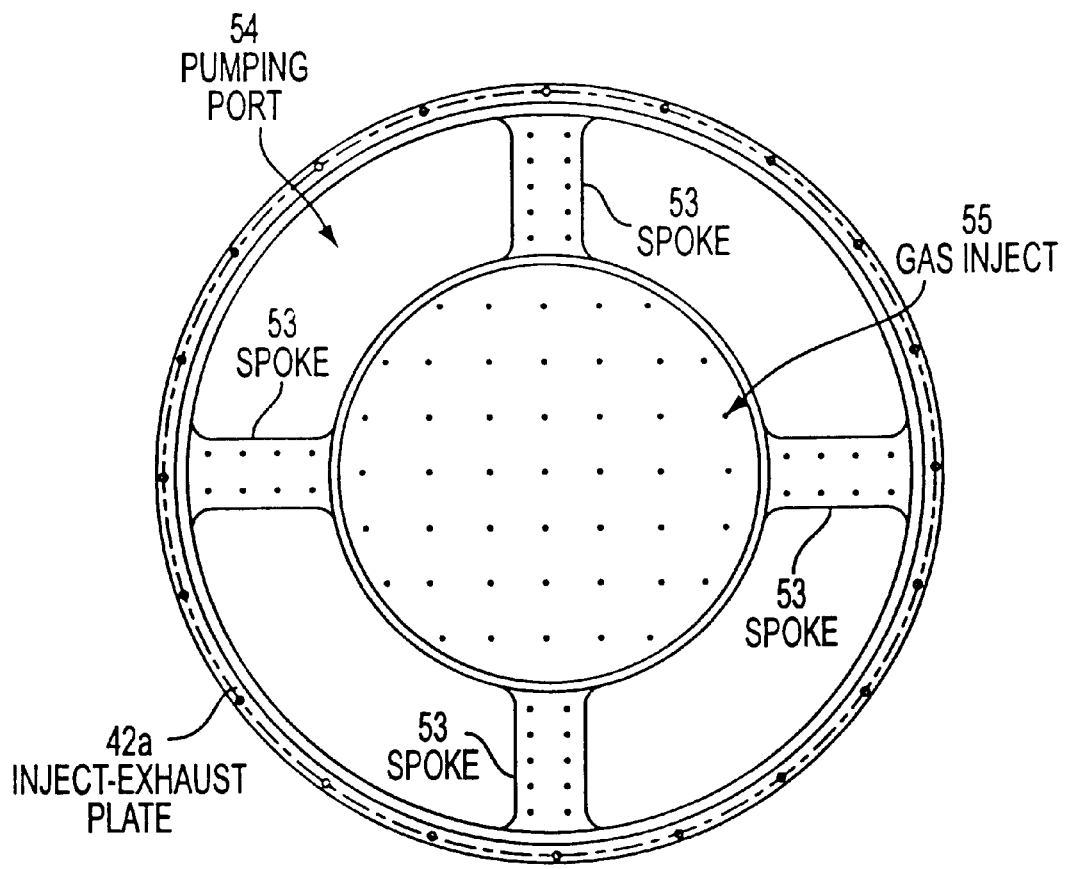
FIG. 6 is a bottom plan view of an inject-exhaust plate with spoke cross-section return path.

The bottom plan view of inject-exhaust plate 42a with spoke cross-section return path in FIG. 6 includes spokes 53 defining pumping ports 54 there between. Gas injects 55 are positioned on the spokes and in the central portion of plate 42a.

Figure 7:
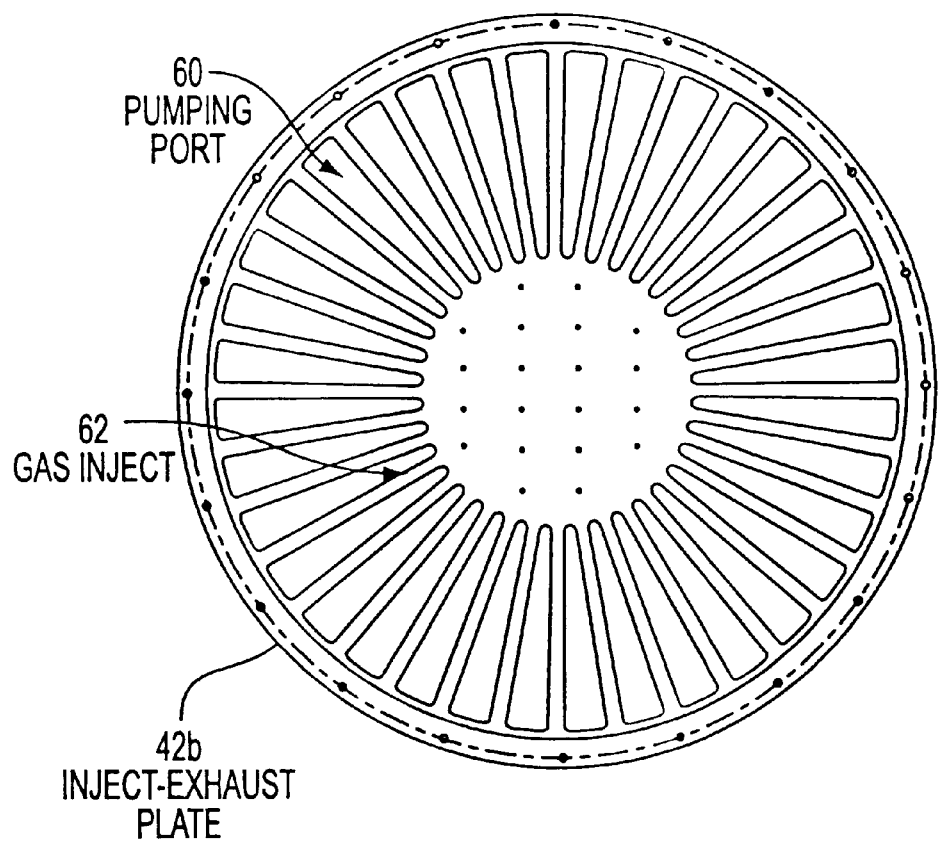
FIG. 7 is a bottom plan view of an inject-exhaust plate with multiple return paths.

The bottom plan view of inject-exhaust plate 42b with multiple return paths in FIG. 7 includes elongated pumping ports 60 extending radially outward from the center of plate 42b. Gas injects 62 extend radially outward from the center of plate 42b and are also positioned in the central portion of plate 42b.

Figure 8:
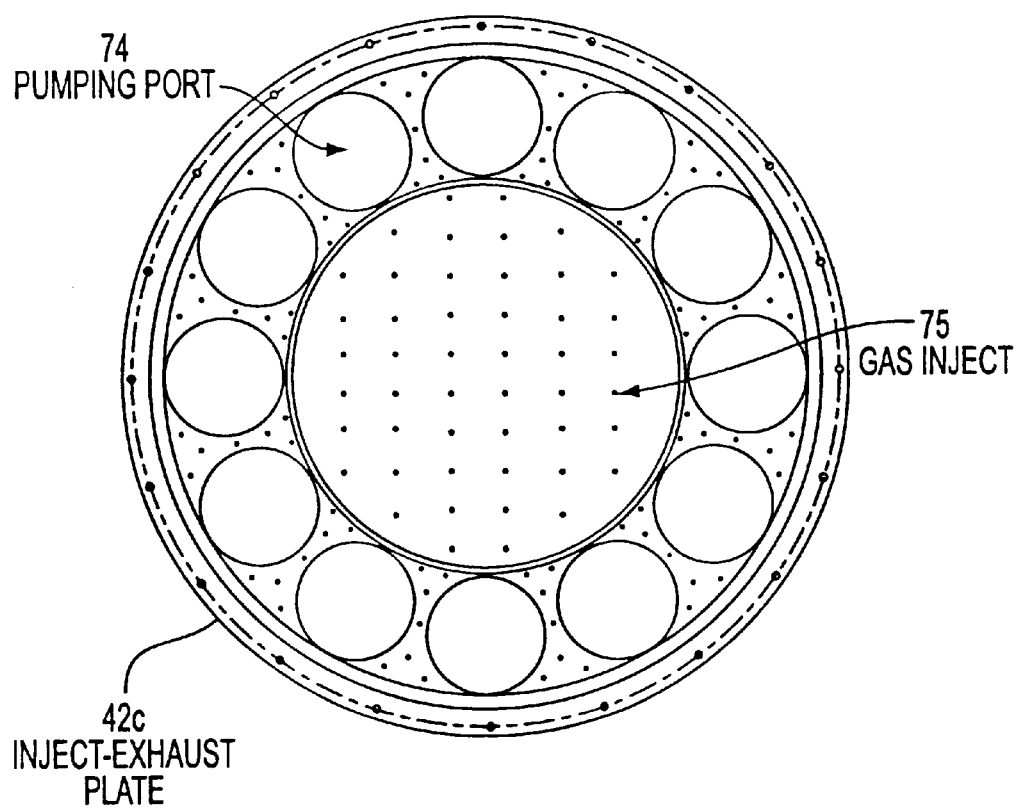
FIG. 8 is a bottom plan view of an inject-exhaust plate with circular pumping ports.

The bottom plan view of inject-exhaust plate 42c with circular pumping ports in FIG. 8 includes circular pumping ports 74 arranged near the circumference of plate 42c. Gas injects 75 extend radially outward from the center of the plate 42c and are also positioned in the central portion of plate 42c.

Figure 9:
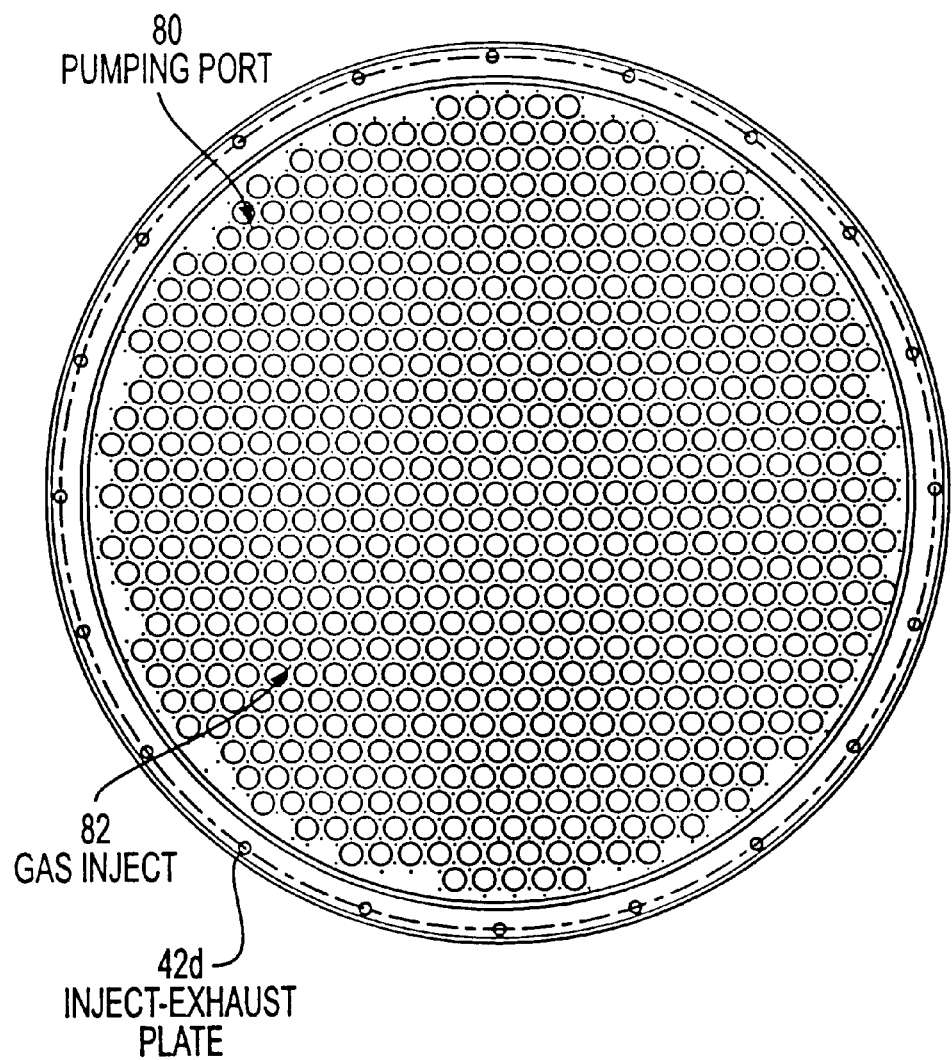
FIG. 9 is a bottom plan view of an inject-exhaust plate with an array of holes for conductance.

The bottom plan view of inject-exhaust plate 42d in FIG. 9 includes pumping ports 80 and gas injects 82 arranged together throughout the interior of plate 42d.

Figure 10:
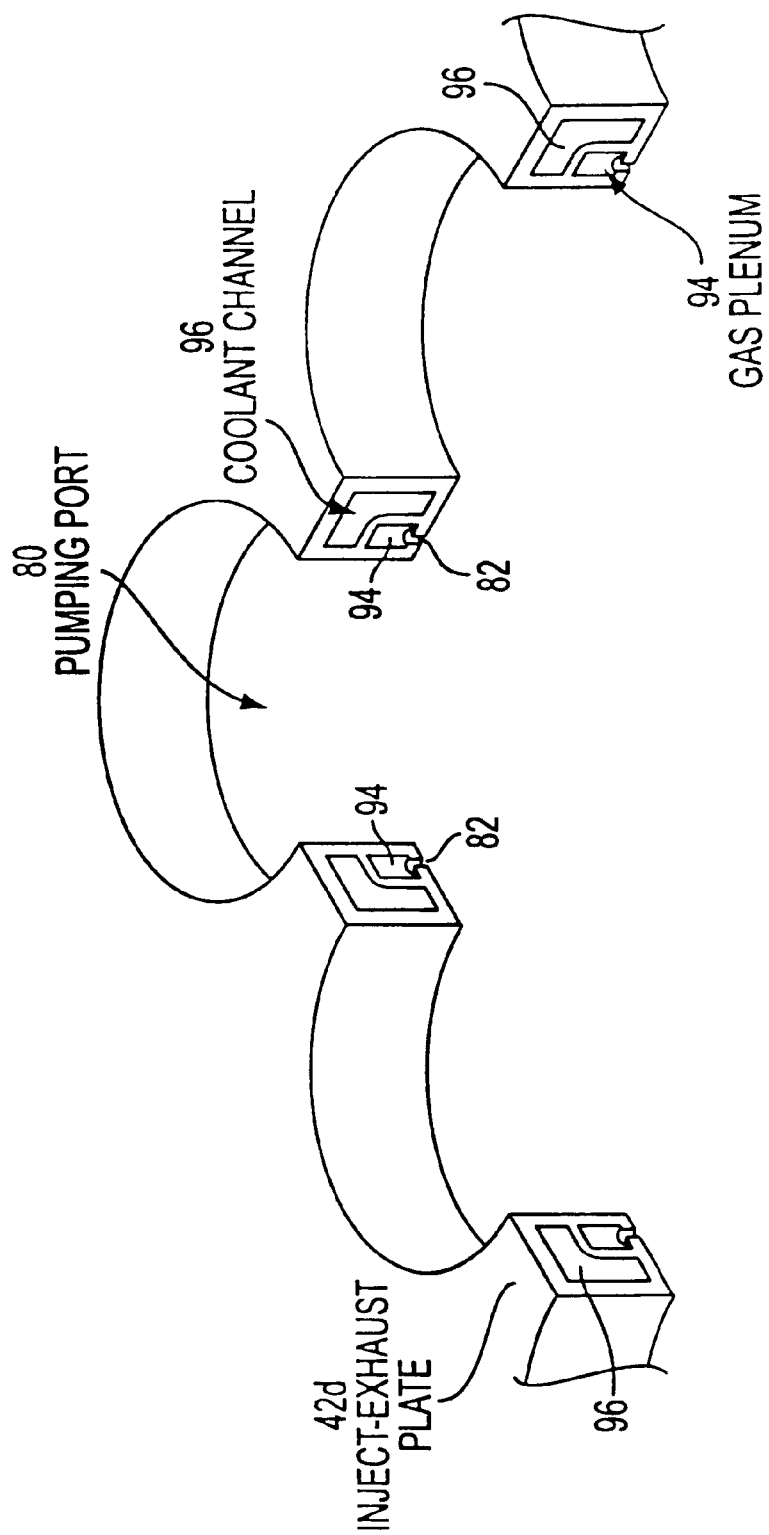
FIG. 10 is a cross-section of the inject exhaust plate of FIG. 9.

FIG. 10 shows a cross-section of inject-exhaust plate 42d Gas injection holes 82 receive operating gas from gas plenum 94. Coolant channels 96 are also provided in inject-exhaust plate 42d for controlling temperatures of the counter electrode.

In general, these inject-exhaust plates are made of anodized aluminum. Anodized aluminum is able to withstand considerable attack by chemicals such as the chlorine and fluorine gases that may be activated by the plasma. Articulated structures of aluminum with convoluted shapes can be made by furnace brazing of tight fitting aluminum parts.

The design of the inject-exhaust plate has a significant effect on the operation of the chamber. This plate must: (1) inject the process gas uniformly over the wafer; (2) allow for gas to be pumped through it without providing significant conductance loss; (3) be temperature controlled to reduce particle generation; (4) be of a material that will not react with the process; and (5) provide low impedance in the RF circuit path.

Inject-exhaust plate 42b in FIG. 7 is preferable to plate 42a in FIG. 6 as regards the impedance of the RF circuit path. Inject-exhaust plate 42d in FIG. 9 provides low impedance and a more uniform exhaust flow. In general, the choice of the design depends upon the process. Some processes are more dependent upon greater pumping speed while other processes operate at low bias voltage and low impedance and require lesser pumping speed.

In operation of the chamber illustrated in FIG. 5, first chuck assembly 30 is lowered. Then wafer 32 is inserted through transfer chamber 41. Wafer 32 comes in on a blade (not shown), which has slots to allow for typically three pins (not shown) in chuck assembly 30. The pins are able to move up and down by a mechanism internal to the chuck assembly 30. Once wafer 32 is over chuck assembly 30, the pins lift wafer 32 off the blade, and the blade is then removed. The pins are lowered so that wafer 32 rests on chuck assembly 30, and chuck assembly 30 is raised with bellows 39 so that chuck assembly 30 seals the chamber and is electrically connected to plasma source 36. Usually, an inert gas such as argon or nitrogen is used between processes to purge the system. Process gas is injected from inject-exhaust plate 42. A relatively high voltage DC source is applied at chuck assembly 30 to electrostatically clamp wafer 32.

RF energy is applied to coil 38 to create a plasma, and RF energy is applied to chuck assembly 30 to accelerate ions to wafer 32 for processing. After ions strike wafer 32, the effluent of the etch process is exhausted through inject-exhaust plate 42. After processing is completed, the RF energy sources are turned off, chuck assembly 30 is lowered by lowering bellows 39, and wafer 32 is removed through transfer chamber 41. The plasma level is usually turned to low power and the gas is changed to argon or nitrogen for improved declamping of the wafer.

Figure 2:
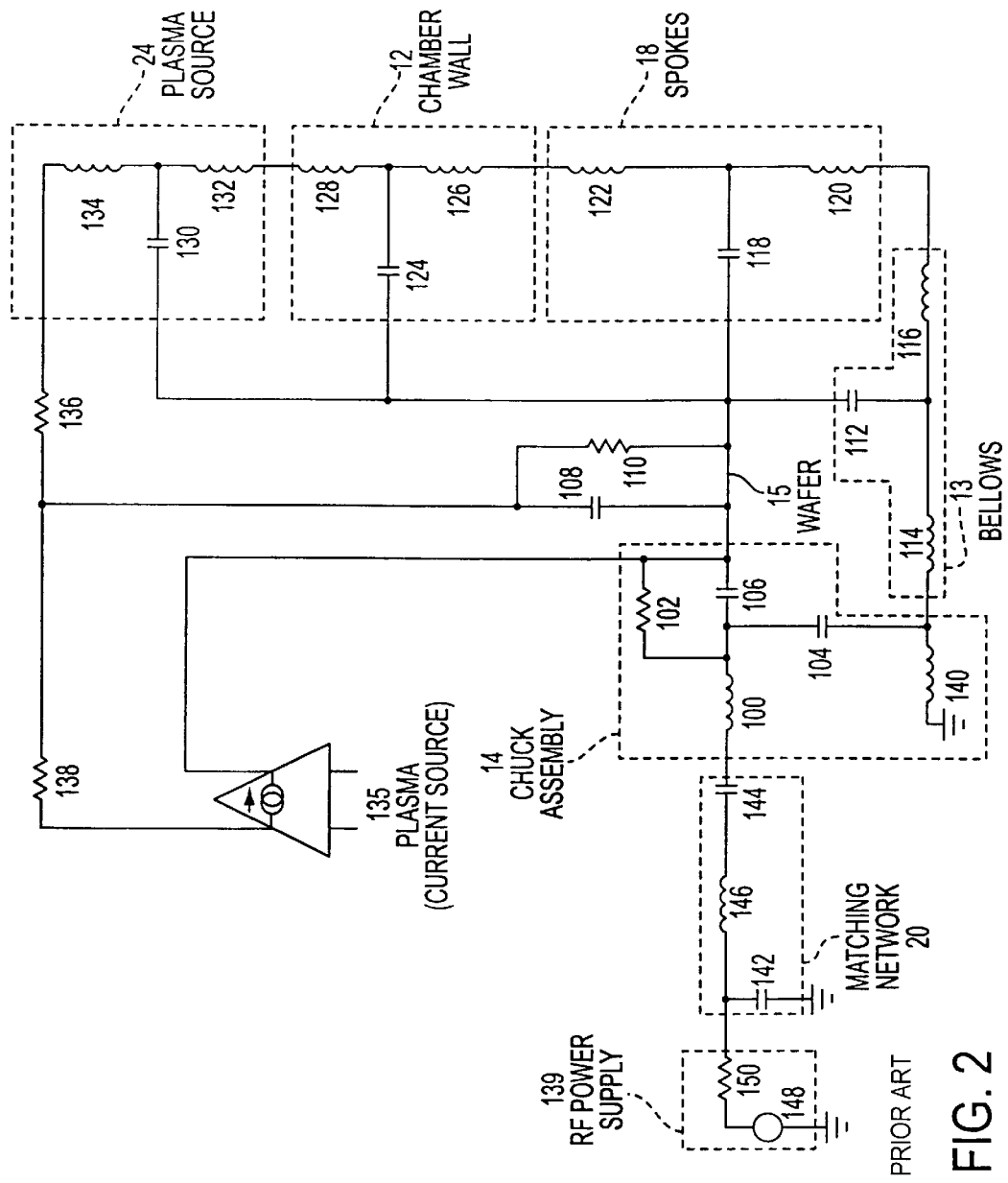
FIG. 2 is an equivalent circuit schematic of a conventional chamber.
Figure 11:
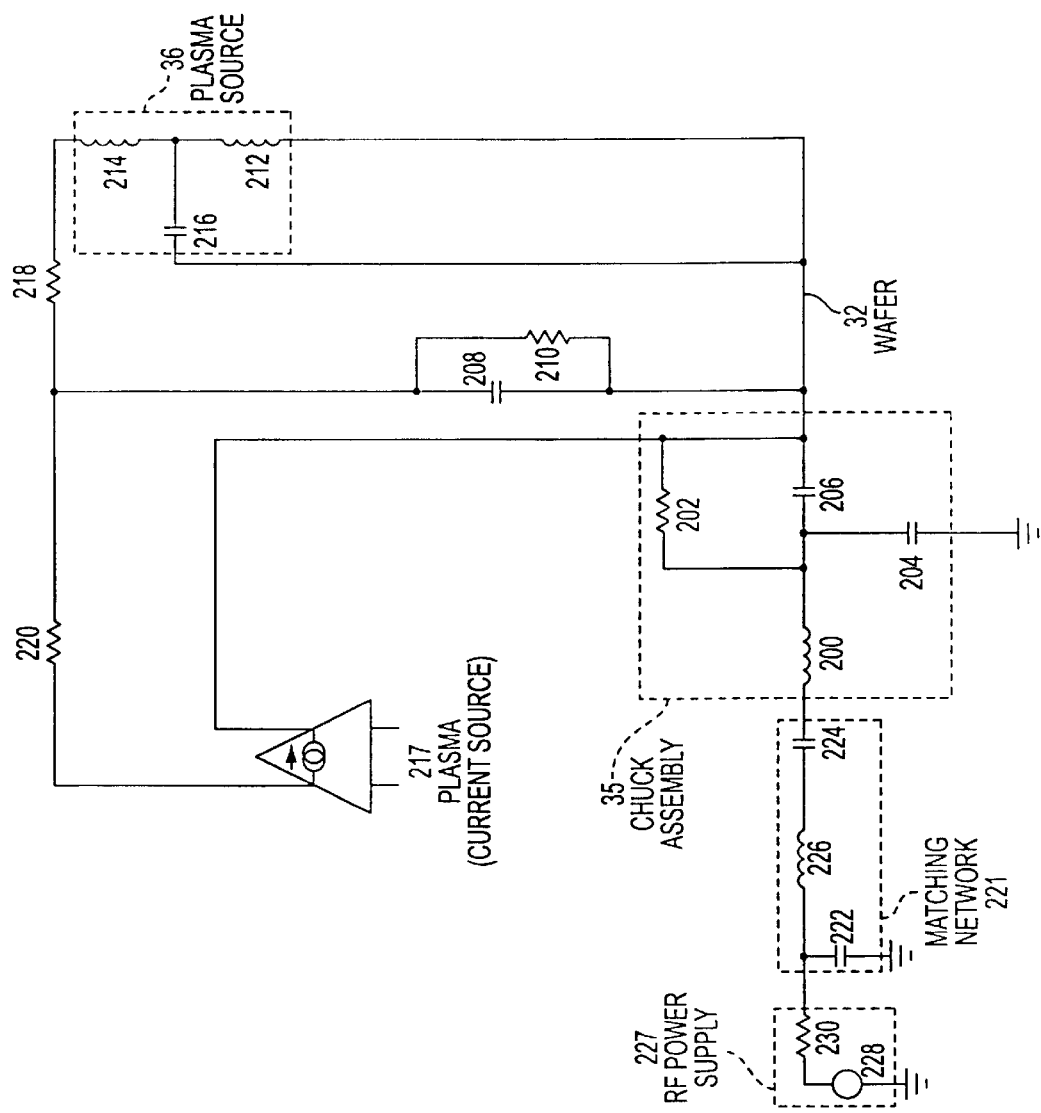
FIG. 11 is an equivalent circuit of a reduced impedance chamber.

Similarly to FIG. 2, which shows a circuit model for the conventional chamber, FIG. 11 shows the schematic of a circuit model of the reduced impedance chamber. Chuck assembly 35, which is modeled by an inductor 200, a resistor 202, a capacitor 204 and a capacitor 206, is adjacent to the position in the circuit corresponding o wafer 32. Proximate to wafer 32 are a capacitor 208 and a resistor 210, which are used to model the RF current that bypasses the sheath and heats the plasma. The rest of the model for the plasma includes a resistor 218, a resistor 220 and a current source 217, where current source 217 produces a current related to plasma parameters at wafer 32. The path to ground from chuck assembly 35 is through plasma source 36, modeled by a capacitor 216, an inductor 212 and an inductor 214. An RF power supply 227, which includes a voltage source 228 and a resistor 230, is connected to chuck assembly 35 through a matching network 221, which is modeled by a capacitor 222, a capacitor 224 and an inductor 226.

A comparison of FIG. 11 and FIG. 2 underscores how the design of the present invention achieves a reduction in impedance as compared with the conventional design. Circuit components corresponding to the bellows, the spokes and the chamber walls are all absent from the circuit of FIG. 11, thereby leading to a reduction in the overall impedance of the system. A comparison of FIG. 5 and FIG. 1 illustrates the corresponding structural removal of these elements from the effective circuit of the reduced impedance chamber in operation.

Figure 3:
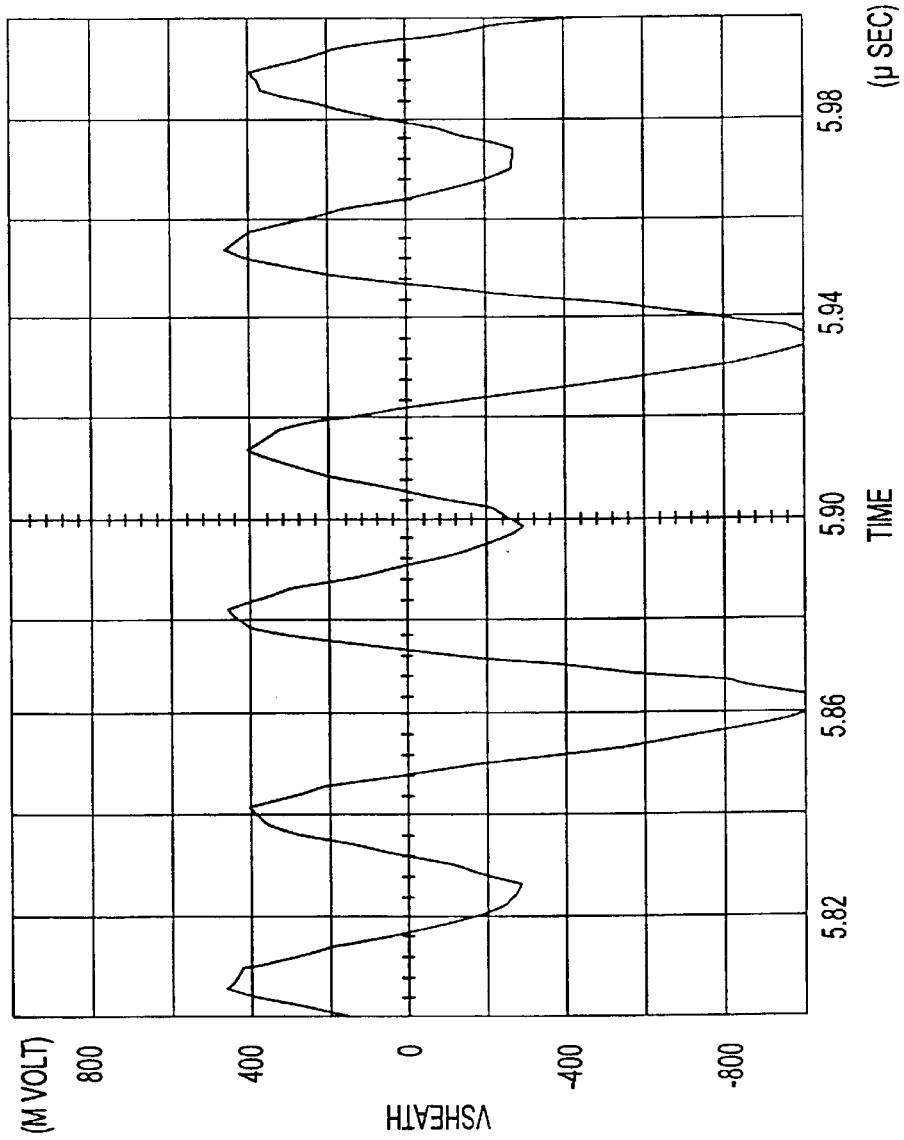
FIG. 3 is a waveform of a sheath voltage versus time from the conventional chamber in FIG. 1.
Figure 12:
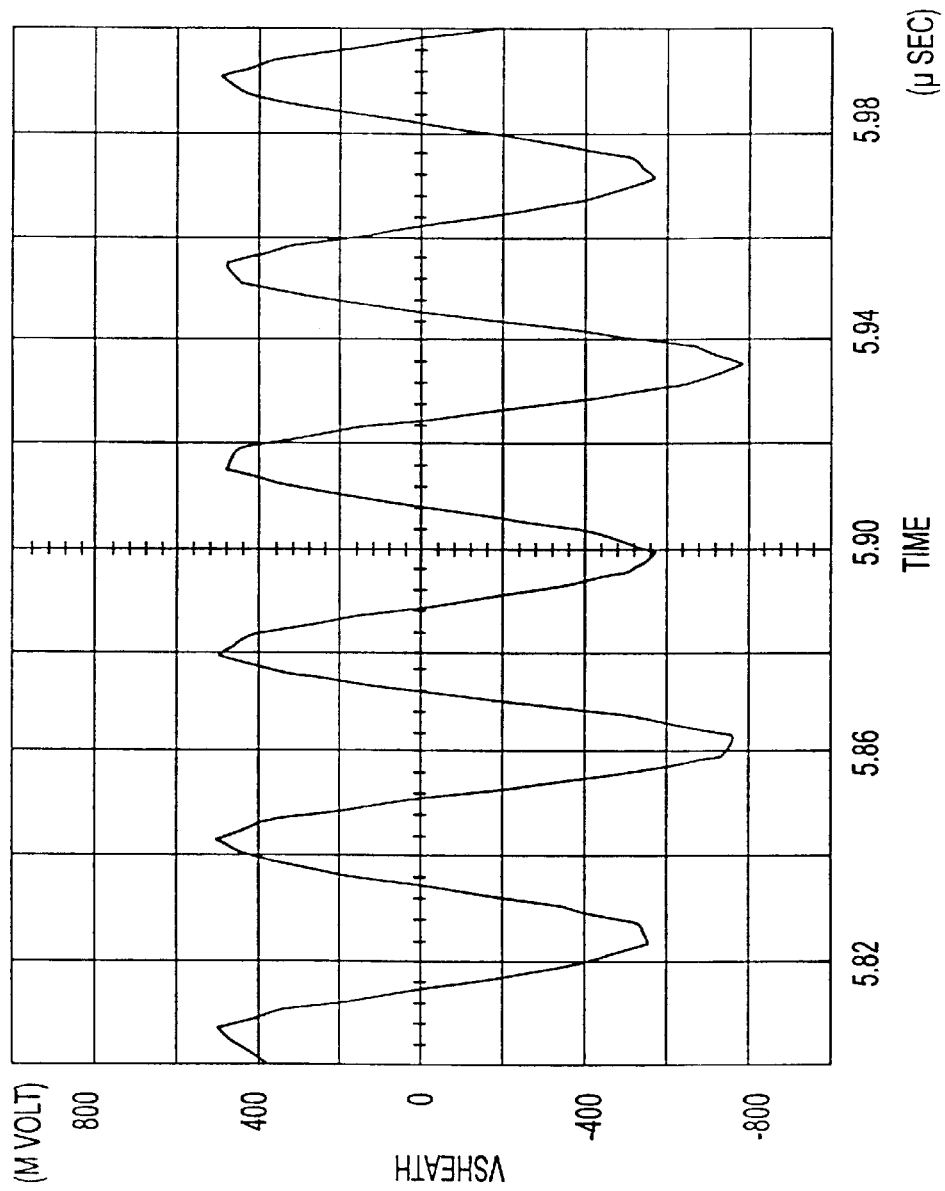
FIG. 12 is a waveform of a sheath voltage versus time from the chamber in FIG. 5.

Similarly to FIG. 3, FIG. 12 shows the waveform of sheath voltage versus time predicted for the equivalent circuit in FIG. 11, which models the reduced impedance chamber. As in the analysis for FIG. 2, this model assumes a perfect match for the fundamental of the RF energy at the input to the matching network 221. The waveform in FIG. 12 is more uniform over time as compared with the waveform of FIG. 3 because of a qualitative difference in spectral content as discussed below.

Figure 4:
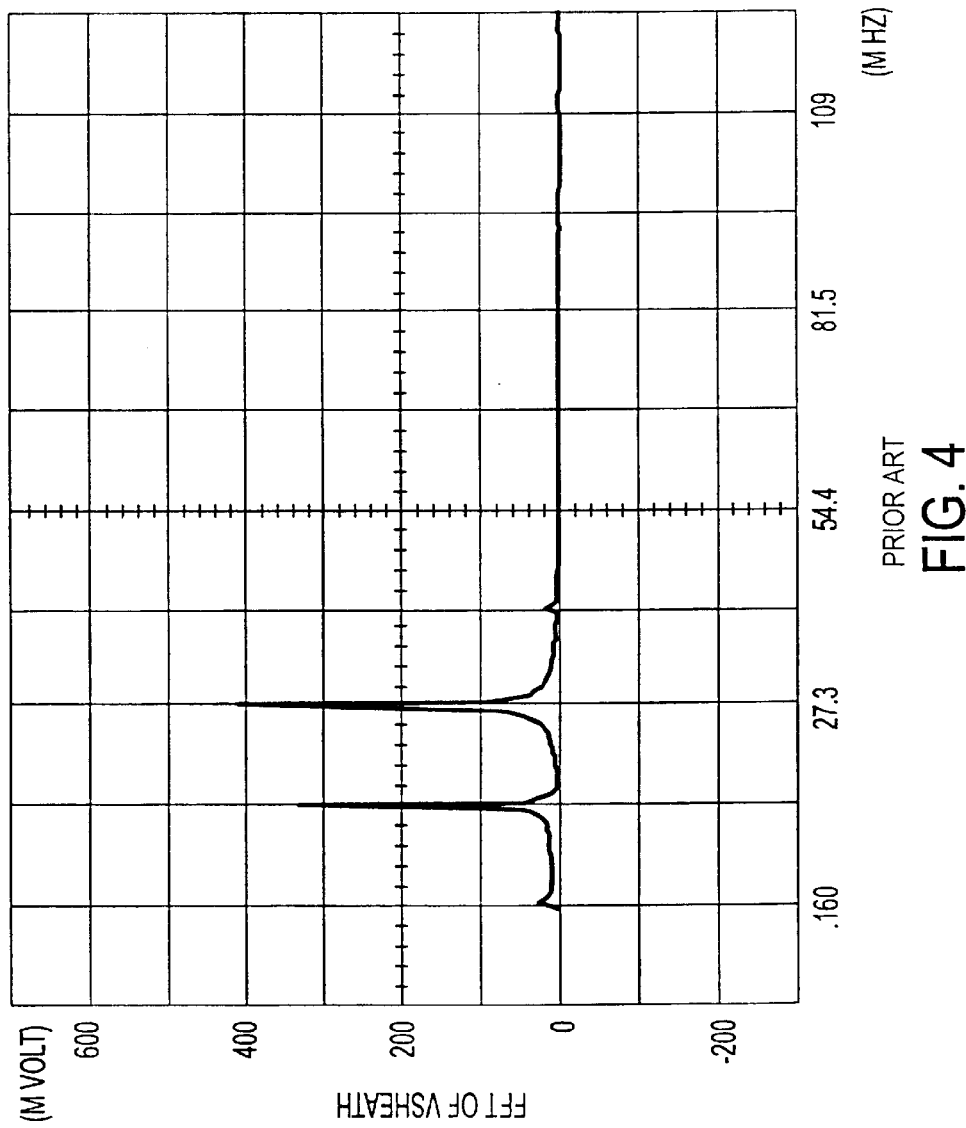
FIG. 4 is a plot of frequency spectra of the conventional chamber illustrated in FIG. 1.
Figure 13:
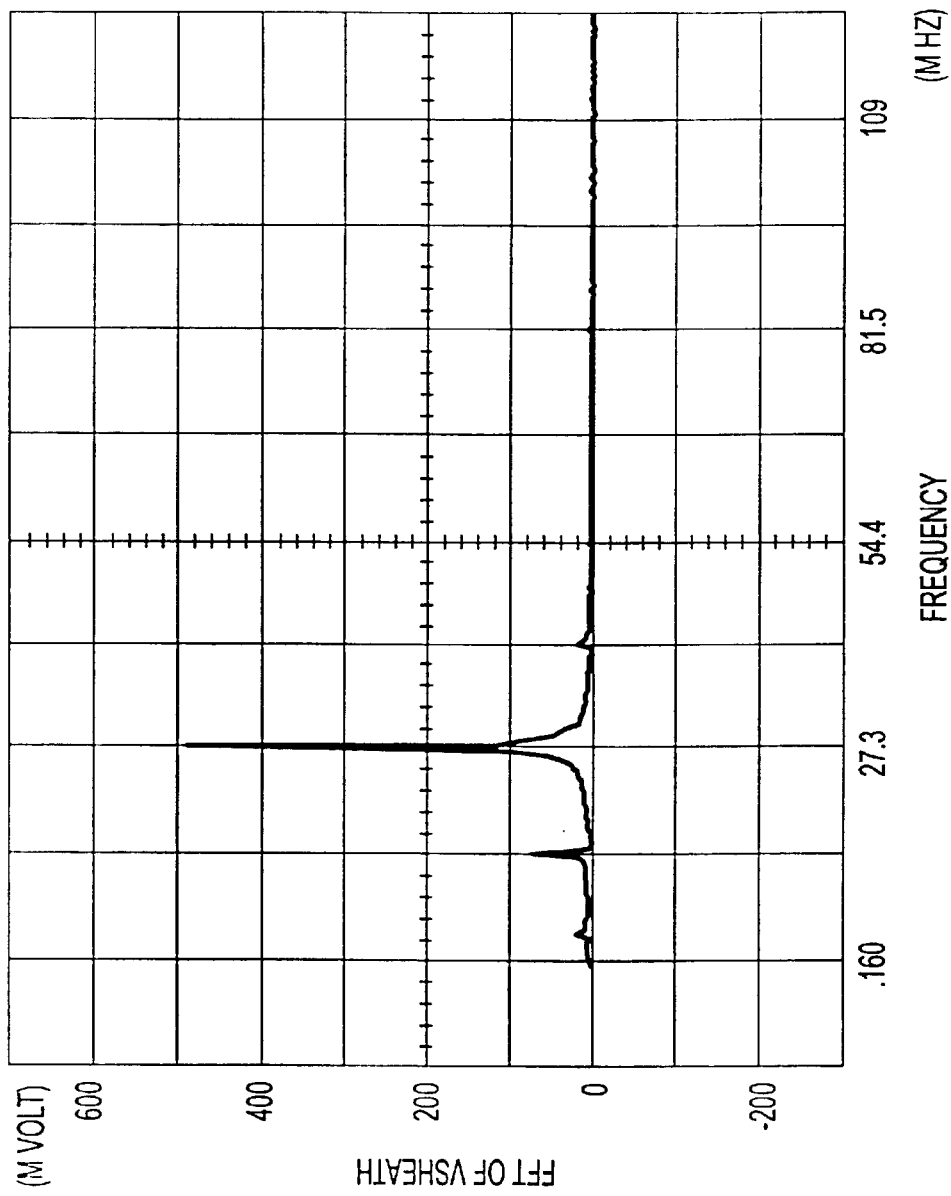
FIG. 13 is a plot of frequency spectra of the chamber with reduced impedance in FIG. 5.

In correspondence to FIG. 4 for the conventional chamber, FIG. 13 shows the frequency spectra of the plasma sheath voltage for the reduced impedance chamber. As is clear from a comparison of FIG. 3 and FIG. 13, the change in chamber design has a dramatic effect on the harmonic content of the voltage across the sheath. Here the fundamental frequency is approximately 13.6 MHz, the first harmonic is approximately 27.2 MHz, and the second harmonic is approximately 40.8 MHz. For the reduced impedance chamber of the present invention, the voltage component of the fundamental has decreased substantially and the voltage component of the first harmonic has increased substantially.

In all of the embodiments described above, the plasma source includes a coil (e.g., coil 38 in FIG. 5) that inductively couples RF energy to create the plasma. Instead, it is also possible to capacitively couple RF energy to create the plasma. FIGS. 15, 15A, 16, and 17 show such an arrangement.

Figure 15:
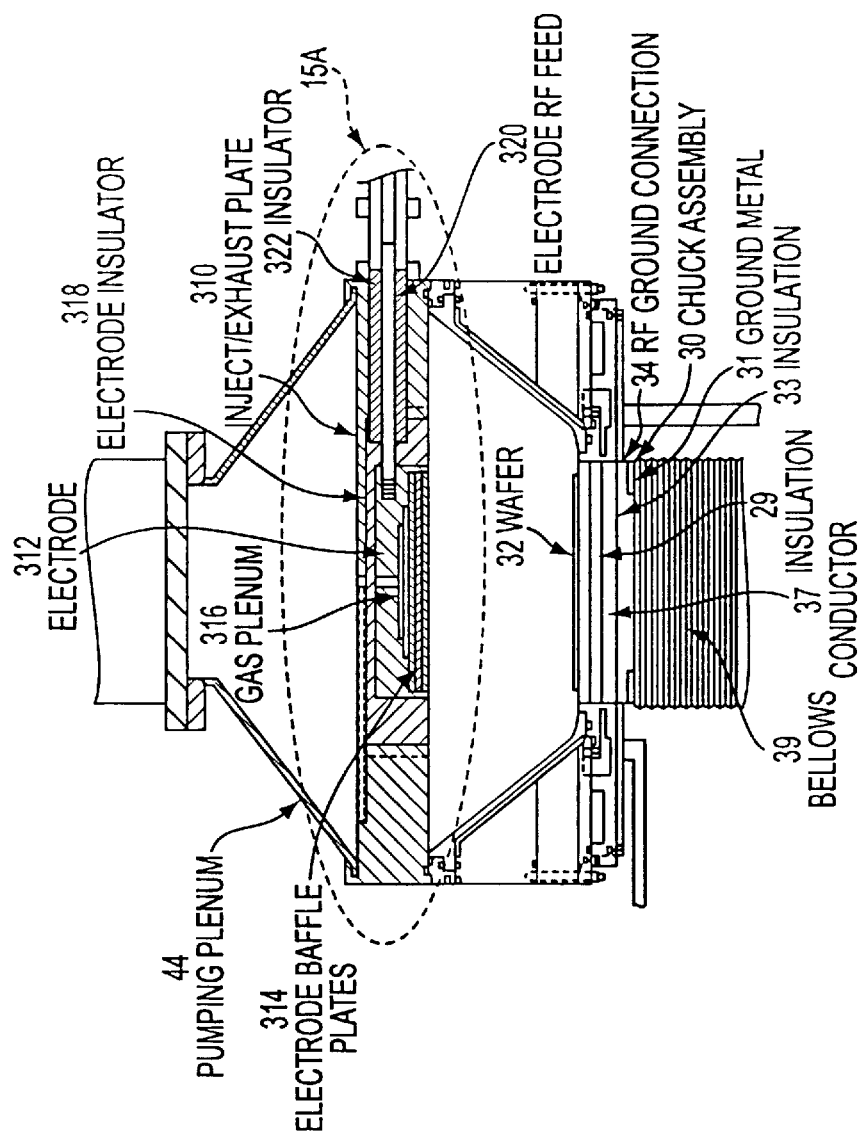
FIG. 15 is a side elevation view, partially in section, of a second preferred embodiment of the reduced impedance chamber of the present invention.

The diagram of a second preferred embodiment of the reduced impedance chamber of the present invention in FIG. 15 includes the following elements as illustrated in FIG. 5: bellows 39, conductor 37, insulation layers 29 and 33, ground metal 31, chuck assembly 30, RF ground connection 34, wafer 32 and pumping plenum 44. Coil 38, plasma source 36, and electrostatic shield 40, as shown in FIG. 5, are eliminated in the second preferred embodiment.

Figure 15A:
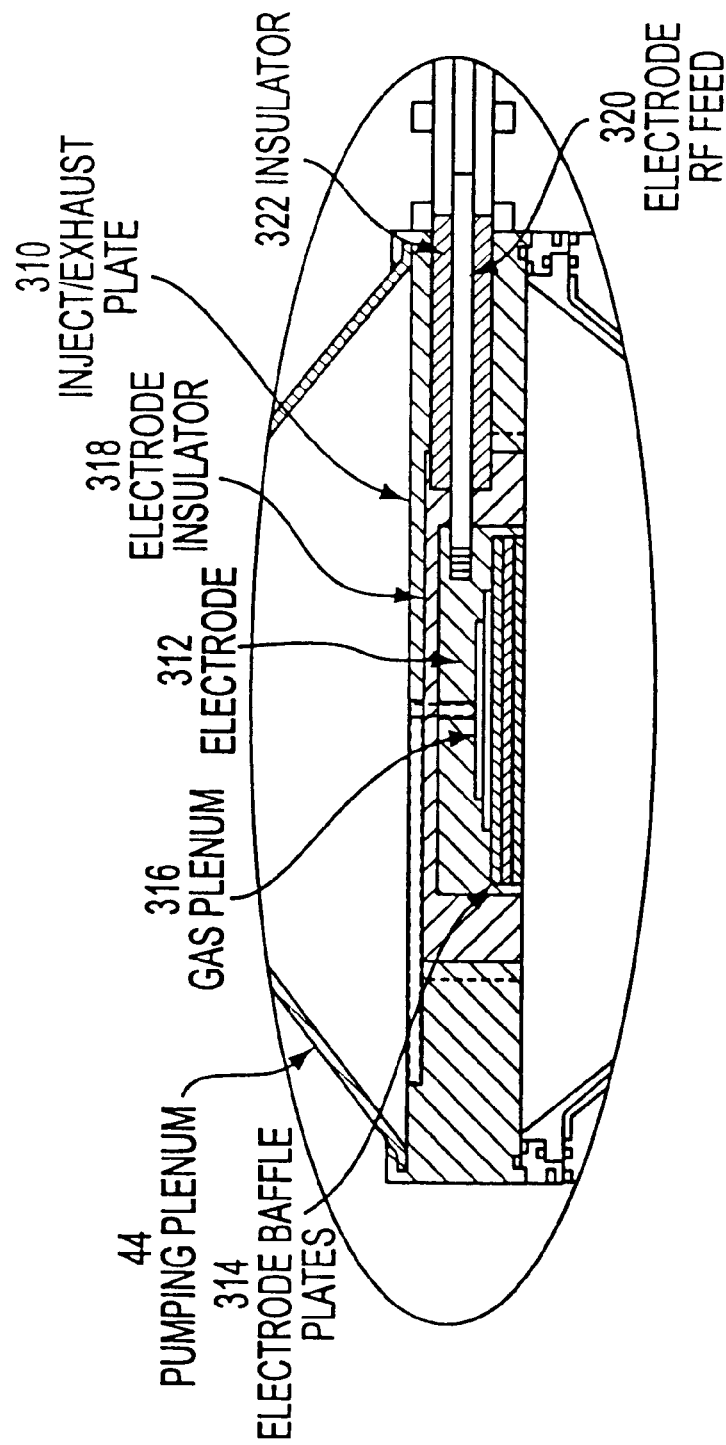
FIG. 15A is a partial side elevation view, partially in section, of the second preferred embodiment of the inject-exhaust plate of the present invention.

An inject-exhaust plate 310 having a driven electrode 312 is shown in more detail in FIG. 15A. Driven electrode 312 includes electrode baffle plates 314, which operate to allow an even distribution of process gas via a gas plenum 316. Electrode 312 is electrically isolated from the chamber by electrode insulator 318 and is driven by an electrode RF feed 320, which is electrically isolated by insulator 322.

Figure 16:
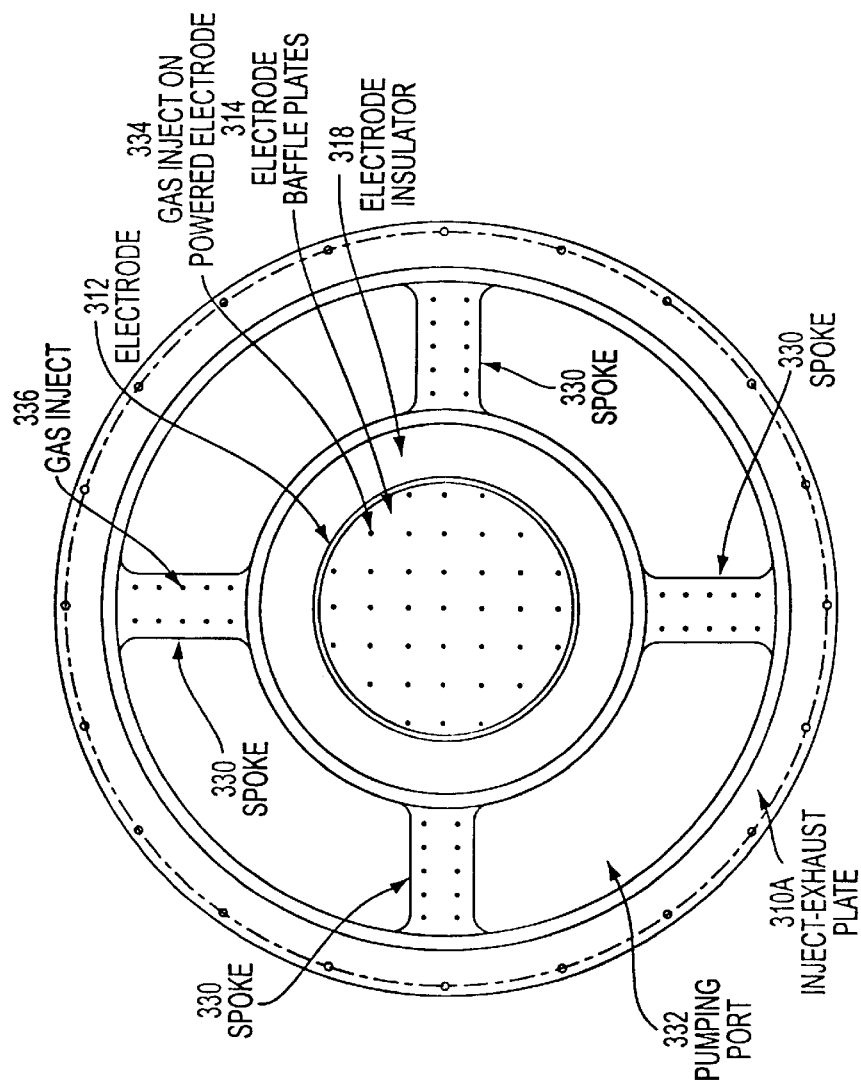
FIG. 16 is a bottom plan view of an inject-exhaust plate with spoke cross-section return path and a powered electrode.
Figure 17:
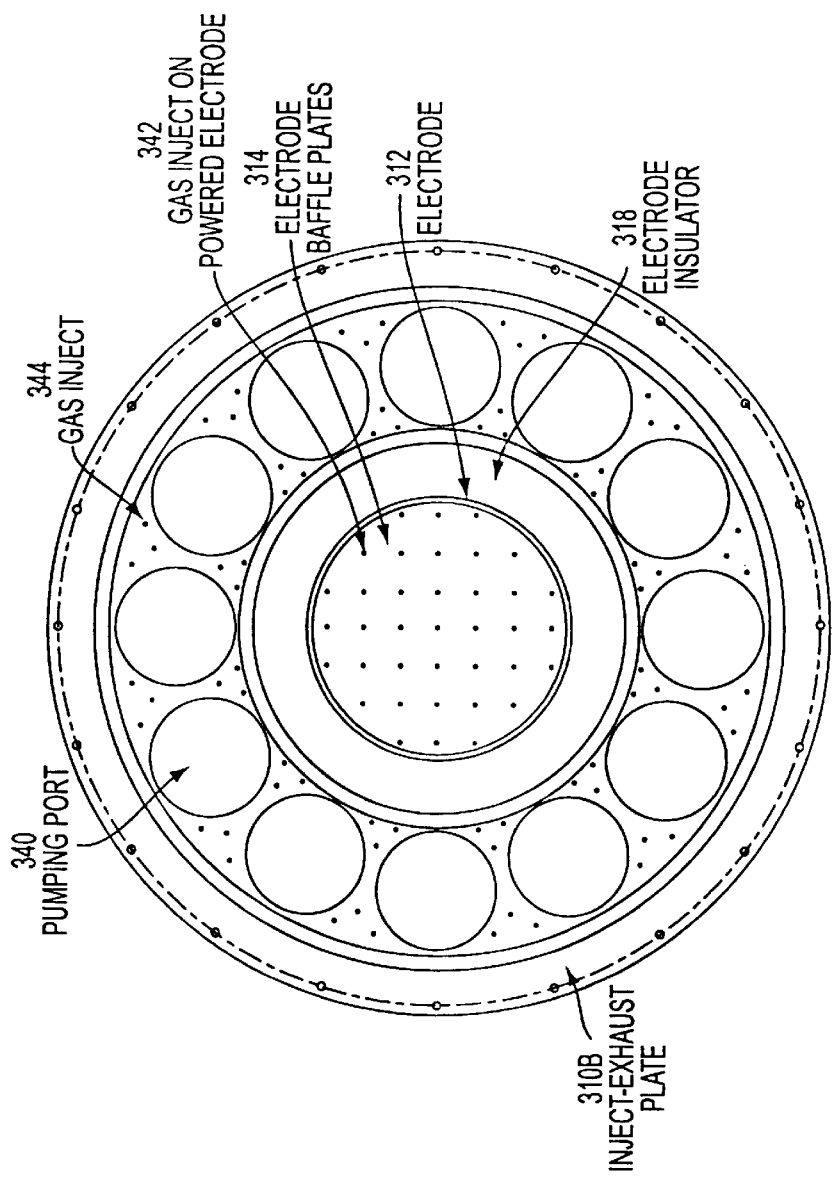
FIG. 17 is a bottom plan view of an inject-exhaust plate with circular pumping ports and a powered electrode.

Preferred embodiments of inject-exhaust plates 310 are illustrated in FIGS. 16 and 17. Similarly as in the preferred embodiments of inject-exhaust plate 42, the gas injection pattern may change for a given system under different operating conditions. Preferably the gas injection pattern is chosen to create a substantially uniform gas delivery rate at the base of the chuck near wafer 32.

The bottom plan view of inject-exhaust plate 310a with spoke cross-section return path in FIG. 16 shares common design features with inject-exhaust plate 42a in FIG. 6. Inject-exhaust plate 310a includes spokes 330 defining pumping ports 332 there between. Gas injects 334 are positioned on powered electrode 312, which defines the central part of inject-exhaust plate 310a. Additional gas injects 336 are positioned on the spokes, where a different gas flow may be used to create desirable process features such as a substantially uniform gas delivery rate to wafer 32.

The bottom plan view of inject-exhaust plate 310b with circular pumping ports in FIG. 17 shares common design features with inject-exhaust plate 42c in FIG. 8. Inject-exhaust plate 310b includes circular pumping ports 340 arranged near the circumference of plate 310b. Gas injects 342 are positioned on powered electrode 312, which defines the central part of inject-exhaust plate 310b. Additional gas injects 344 extend radially outward from the center of the plate 310b, where a different gas flow may be used to create desirable process features as discussed above.

Figure 14:
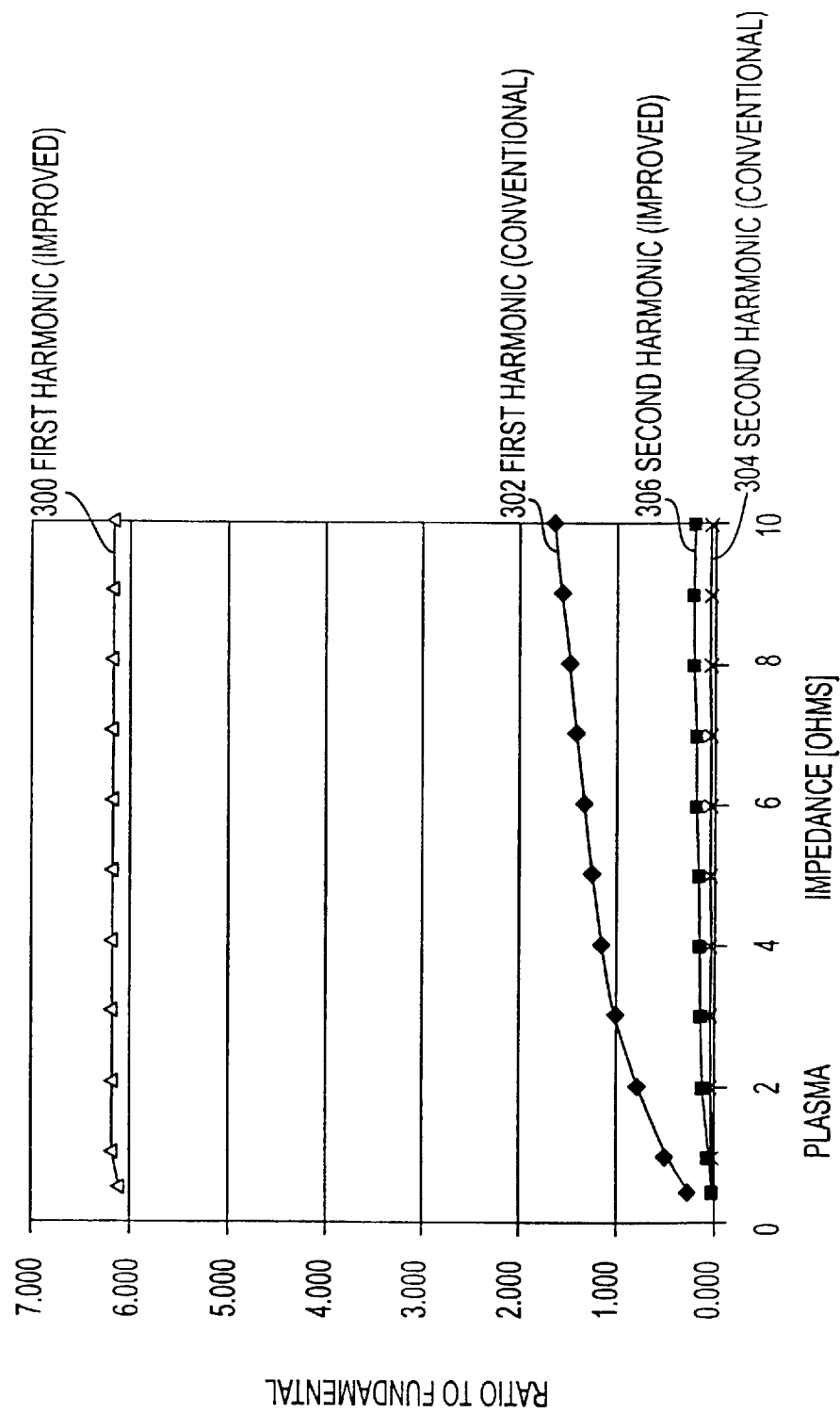
FIG. 14 is plot of ratios of harmonics to fundamental for the conventional chamber of FIG. 1 and the chamber with reduced impedance of FIG. 5.

In FIG. 14 is a graph of the ratios of plasma sheath voltage harmonics to fundamental for improved and conventional chamber designs as a function of plasma impedance. For the improved design of the present invention, the ratio of the voltage component of the first harmonic to the voltage component of the fundamental is given by curve 300, and the corresponding result for the conventional design is given by curve 302. The ratio of the voltage component of the second harmonic to the voltage component of the fundamental for the improved design is given by curve 306, and the corresponding result for the conventional design is given by curve 304. The curves corresponding to the improved chamber design of the present invention demonstrate a relative insensitivity with respect to variations in plasma impedance and a relative dominance of the first harmonic over the second harmonic and the fundamental. This necessarily requires an improvement in the match network. Improved match point accuracy and a high Q are both needed for this improvement to be attained.

For the present invention, the relative insensitivity of the frequency components with respect to plasma impedance results in more repeatable processing despite inevitable uncertainties in processing conditions. As discussed above, unreliable process conditions can result from many sources including: (1) system to system manufacturing variations; (2) variations in system configuration during refitting; (3) variations in sheath thickness (ion density) because of imprecise control of plasma density; and (4) bellows extension.

In FIG. 14, as the plasma impedance is changed, the ratio of the first harmonic to the fundamental for the reduced impedance chamber is relatively constant while the corresponding first harmonic content of the conventional chamber varies over a factor of 15.

The plasma process is best controlled if the ions at the element to be processed are relatively monoenergetic. Monte-carlo simulations have shown that the ion energy spread and the mean ion energy are both very sensitive functions of the voltage levels of the various harmonics that exist across the sheath. With the first harmonic dominant and the ratios of the harmonics essentially fixed, variations with respect to an energy-measuring parameter such as plasma density will likely be monotonic if not mono-energetic.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A chamber for plasma processing, comprising:
    a chuck assembly for mounting a workpiece to be processed, the chuck assembly including a driven electrode and a ground portion;
    a counter electrode; and
    a plasma source for generating a plasma in the chamber from process gas and having a wall portion, the wall portion of the plasma source being directly electrically connected to the counter electrode and the ground portion of the chuck assembly;
    wherein the counter electrode includes an inject-exhaust plate; and
    wherein the inject-exhaust plate is mounted in a position opposed to the chuck assembly; and wherein the chamber further comprises
    a turbo-molecular pump for pumping effluent; and
    a pumping plenum for transferring effluent from the chamber to the turbo-molecular pump, wherein the inject-exhaust plate separates the plasma source from the pumping plenum and the turbo-molecular pump.

2. A chamber for plasma processing, as claimed in claim 1, wherein the counter electrode forms a portion of the plasma source.

3. A chamber for plasma processing, as claimed in claim 2, wherein the plasma source includes a source of RF energy connected to the portion of the counter electrode.

4. A chamber for plasma processing, as claimed in claim 3, wherein the portion of the counter electrode is constructed and arranged to create a uniform gas delivery to the chuck assembly.

5. A chamber for plasma processing, as claimed in claim 1, wherein the inject-exhaust plate comprises:
    a plurality of gas injects for injecting process gas into the chamber; and
    a plurality of pumping ports for exhausting effluent, wherein
    the gas injects operate to inject process gas substantially uniformly over a surface of a workpiece to be processed; and
    the pumping ports operate to allow exhaust of effluent without a significant conductance loss.

6. A chamber for plasma processing, as claimed in claim 5, wherein the inject-exhaust plate includes materials that are non-reactive with respect to plasma processing.

7. A chamber for plasma processing, as claimed in claim 5, wherein the inject-exhaust plate is made of anodized aluminum.

8. A chamber for plasma processing, as claimed in claim 5, wherein the inject-exhaust plate further comprises a plurality of gas plenums for transferring process gas from a process gas source to the gas injects.

9. A chamber for plasma processing, as claimed in claim 5, wherein the inject-exhaust plate further comprises a plurality of coolant channels for controlling temperatures of the counter electrode.

10. A chamber for plasma processing, comprising:
a chuck assembly for mounting a workpiece to be processed, the chuck assembly including a driven electrode, a ground portion and a bellows;
a counter electrode; and
a plasma source for generating a plasma in the chamber from process gas and having a wall portion, wherein
the bellows in a raised position operates to cause the ground portion of the chuck assembly to seal a volume within the chamber so that the plasma source is directly electrically connected to the counter electrode and the ground portion of the chuck assembly.

11. A chamber for plasma processing, as claimed in claim 10, further comprising a transfer chamber, wherein the bellows in a lowered position operates to unseal the chamber and to allow ingress and egress of the workpiece to be processed from and to the transfer chamber, the transfer chamber being outside the sealed volume of the chamber when the bellows is in the raised position.

12. A chamber for plasma processing, as claimed in claim 10, wherein the bellows is outside the sealed volume when the bellows is in a raised position.

13. A chamber for plasma processing, as claimed in claim 1 or claim 10, wherein
the plasma source further comprises a coil for generating an electromagnetic field, and
the wall portion of the plasma source includes an electrostatic shield.

14. A chamber for plasma processing, as claimed in claim 1 or claim 10, wherein the chuck assembly further comprises:
a first insulating layer,
a second insulating layer, and
a conducting layer including one or more conducting portions, the conducting layer lying between the first insulating layer and the second insulating layer, wherein
the second insulating layer lies between the conducting layer and the ground portion of the chamber; and
the chamber further comprises a DC voltage source, the DC voltage source being electrically connected to the one or more conducting portions of the conducting layer and operating to fix a workpiece to be processed to the first insulating layer.

15. A chamber for plasma processing, as claimed in claim 1 or claim 10, wherein the counter electrode has a surface area larger than a surface area of the driven electrode.

16. A chamber for plasma processing, as claimed in claim 15, wherein the wall portion of the plasma source tapers from a wider cross sectional area near the counter electrode to a narrower cross sectional area near the driven electrode.

17. A chamber for plasma processing, as claimed in claim 1 or claim 13, wherein the wall portion of the plasma source tapers from a wider cross sectional area near the counter electrode to a narrower cross sectional area near the driven electrode.

18. A chamber for plasma processing, as claimed in claim 1 or claim 10, wherein a sheath voltage waveform of a plasma created by the plasma source is substantially independent of plasma impedance over a range of plasma impedance.

* * * * *